United States Patent
Radic

(10) Patent No.: US 11,664,736 B2
(45) Date of Patent: *May 30, 2023

(54) AUTO-TUNED SYNCHRONOUS RECTIFIER CONTROLLER

(71) Applicant: Silanna Asia Pte Ltd, Singapore (SG)

(72) Inventor: Aleksandar Radic, Toronto (CA)

(73) Assignee: Silanna Asia Pte Ltd, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 17/448,834

(22) Filed: Sep. 24, 2021

(65) Prior Publication Data

US 2022/0014111 A1   Jan. 13, 2022

Related U.S. Application Data

(63) Continuation of application No. 16/811,827, filed on Mar. 6, 2020, now Pat. No. 11,133,747.

(51) Int. Cl.
*H02M 3/335*   (2006.01)
*H02M 3/158*   (2006.01)

(52) U.S. Cl.
CPC ..... *H02M 3/33592* (2013.01); *H02M 3/1588* (2013.01)

(58) Field of Classification Search
CPC ........... H02M 3/33592; H02M 3/1588; H02M 1/0058; H02M 1/083; Y02B 70/10
See application file for complete search history.

(56) References Cited

U.S. PATENT DOCUMENTS

| 7,859,868 B2 | 12/2010 | Huang |
| 8,416,587 B2 | 4/2013 | Chen |
| 8,669,744 B1 | 3/2014 | Vinciarelli |
| 10,063,154 B2 | 8/2018 | Ptacek et al. |

(Continued)

OTHER PUBLICATIONS

Alexander Connaughton Meng. Secondary Side Controlled Flyback Converter. DOCTORALTHESIS, Graz University of Technology [online]. Feb. 2018 [retrived on May 14, 2021], Retrived fromthe Internet: . pp. 19-43, 69; and figures 4.2-5.7.

(Continued)

*Primary Examiner* — Kyle J Moody
(74) *Attorney, Agent, or Firm* — MLO, a professional corp.

(57) ABSTRACT

An apparatus includes a high-pass filter circuit configured to receive a drain-source voltage from a drain node of a synchronous rectifier switch at a secondary-side of a power converter and to generate a filtered drain-source voltage using the received drain-source voltage. A current comparison circuit of the apparatus is configured to receive a current indicative of a current through the synchronous rectifier switch and to generate a current comparison signal using the received current. An auto-tuning controller of the apparatus is configured to turn the synchronous rectifier switch on upon determining a body diode conduction of the synchronous rectifier switch, commence an auto-tuned delay upon determining that the current through the synchronous rectifier switch has changed direction, turn the synchronous rectifier switch off upon expiration of the auto-tuned delay, and update, during a detection window of time, a duration of the auto-tuned delay based on the filtered drain-source voltage.

20 Claims, 8 Drawing Sheets

(56) References Cited

U.S. PATENT DOCUMENTS

| | | |
|---|---|---|
| 11,133,747 B1 * | 9/2021 | Radic .................. H02M 1/0058 |
| 2014/0043863 A1 | 2/2014 | Telefus et al. |
| 2016/0261204 A1 | 9/2016 | Kikuchi et al. |
| 2018/0294734 A1 | 10/2018 | Song et al. |
| 2020/0036280 A1 | 1/2020 | Yang et al. |
| 2020/0280264 A1 | 9/2020 | Kado et al. |
| 2021/0135680 A1 | 5/2021 | Radic |

OTHER PUBLICATIONS

International Search Report dated Jun. 4, 2021 for PCT Patent Application No. PCT/IB2021/051650.

Notice of Allowance and Fees dated May 27, 2021 for U.S. Appl. No. 16/811,827.

Zhang et al., Design Considerations and Performance Evaluations of Synchronous Rectification in Flyback Converters, IEE Transactions on Power Electronics, vol. 13, No. 3, May 1998, pp. 538-546.

Zhang, Chapter 2 of Electrical, Thermal, and EMI Designs of High-Density, Low-Profile Power Supplies, Feb. 1998.

* cited by examiner

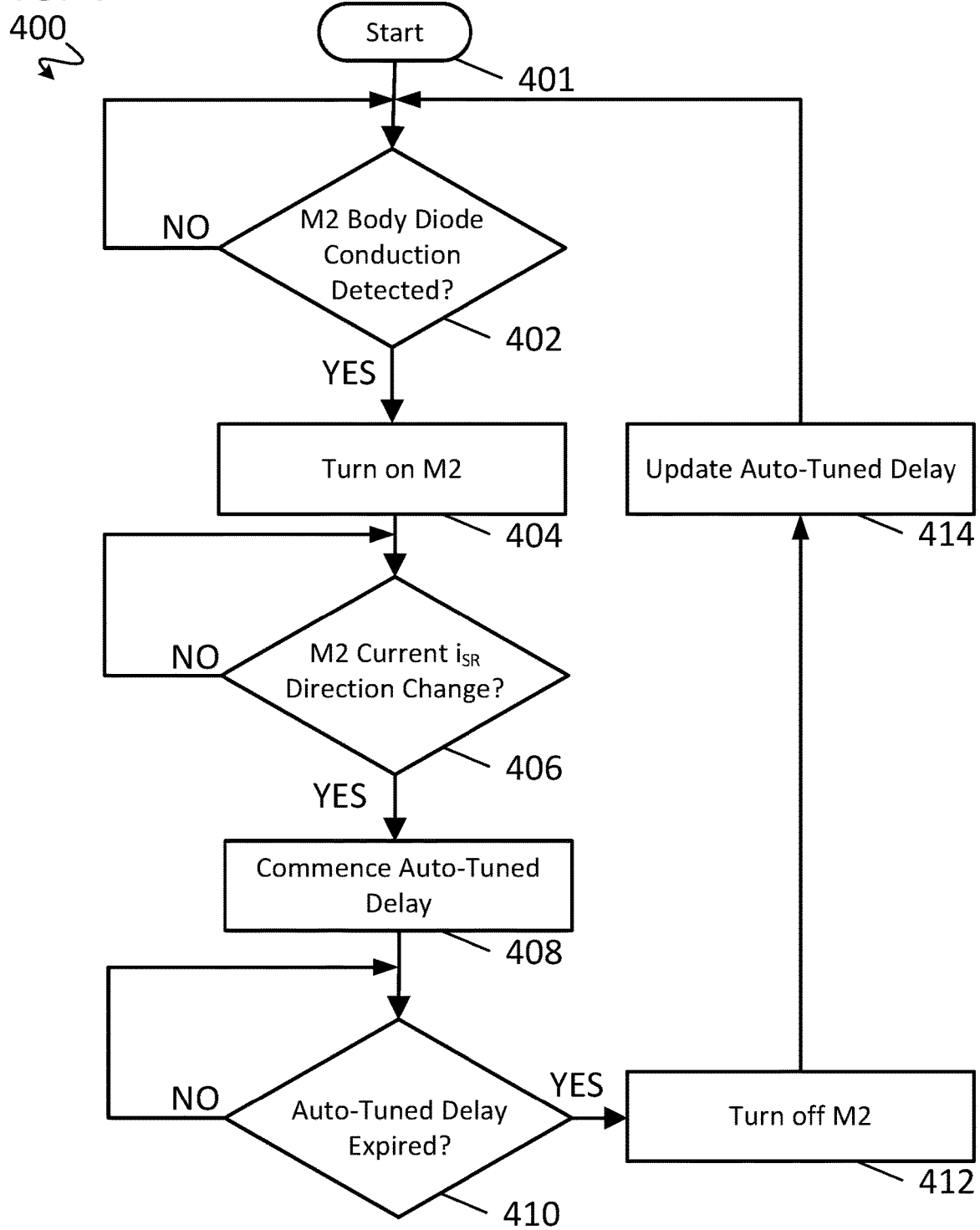

us 11,664,736 B2

AUTO-TUNED SYNCHRONOUS RECTIFIER CONTROLLER

RELATED APPLICATIONS

This application is a continuation of U.S. patent application Ser. No. 16/811,827, filed Mar. 6, 2020, all of which is hereby incorporated by reference in its entirety for all purposes.

BACKGROUND

Switch-mode power supplies (SMPSs) ("power converters") are widely used in consumer, industrial, and medical applications to provide well-regulated power to a load while maintaining high power processing efficiency, tight-output voltage regulation, and reduced conducted and radiated electromagnetic interference (EMI).

Some power converters, such as flyback-converters, include a transformer that galvanically isolates a primary-side of the power converter from a secondary-side of the power converter. In such power converters, a primary-side switch of the power converter controls a flow of current through a primary-side winding of the transformer to charge a magnetizing inductance of the transformer. A synchronous rectifier switch (e.g., a diode or actively controlled switch) on the secondary-side of the power converter controls a flow of current from a secondary-side winding of the transformer to discharge the energy stored in the magnetizing inductance of the transformer, thereby transferring power to a load of the power converter.

Some power losses in the primary-side switch relate to a voltage across the primary-side switch and a current through the primary-side switch when it is transitioned to an ON-state. Power processing efficiency of a power converter may be increased by minimizing a voltage across the primary-side switch before the primary-side switch is turned on.

SUMMARY

In some embodiments, an apparatus includes a high-pass filter circuit configured to receive a drain-source voltage from a drain node of a synchronous rectifier switch at a secondary-side of a power converter and to generate a filtered drain-source voltage using the received drain-source voltage. A current comparison circuit of the apparatus is configured to receive a current indicative of a current through the synchronous rectifier switch and to generate a current comparison signal using the received current. An auto-tuning controller of the apparatus is configured to turn the synchronous rectifier switch on upon determining, using the current comparison signal, a body diode conduction of the synchronous rectifier switch, commence an auto-tuned delay upon determining, using the current comparison signal, that the current through the synchronous rectifier switch has changed direction, turn the synchronous rectifier switch off upon expiration of the auto-tuned delay, and update, during a detection window of time, a duration of the auto-tuned delay based on the filtered drain-source voltage.

In some embodiments, a method involves receiving, at high-pass filter circuit, a drain-source voltage from a drain node of a synchronous rectifier switch at a secondary-side of a power converter. A filtered drain-source voltage is generated, by the high-pass filter circuit, using the received drain-source voltage. A current indicative of a current through the synchronous rectifier switch is received at a current comparison circuit. A current comparison signal is generated, by the current comparison circuit, using the received current. The synchronous rectifier switch is turned on upon determining by an auto-tuning controller, using the current comparison signal, that a body diode conduction of the synchronous rectifier switch has occurred. An auto-tuned delay is commenced, by the auto-tuning controller, upon determining, using the current comparison signal, that the current through the synchronous rectifier switch has changed direction. The synchronous rectifier switch is turned off upon expiration of the auto-tuned delay, and a duration of the auto-tuned delay is updated, by the auto-tuning controller, during a detection window of time, based on the filtered drain-source voltage.

BRIEF DESCRIPTION OF THE DRAWINGS

FIG. 4 is a portion of an example process for operation of the synchronous rectifier controller shown in FIG. 3, in accordance with some embodiments.

DETAILED DESCRIPTION

Figure 1:
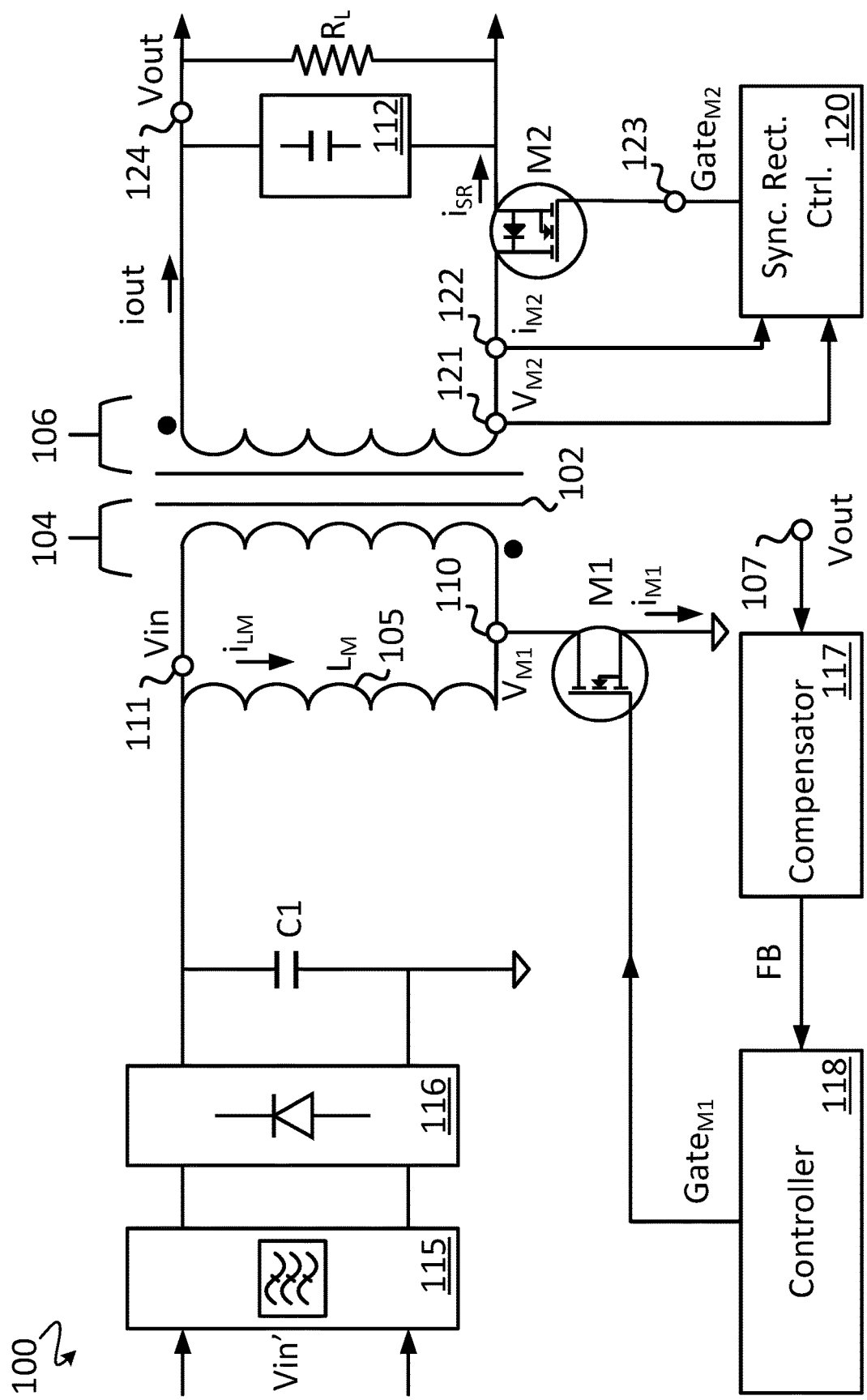
FIG. 1 is a simplified circuit schematic of a power converter, in accordance with some embodiments.

In accordance with some embodiments, a synchronous rectifier controller on a secondary-side of a power converter auto-tunes a duration of time that a negative magnetizing inductance current is developed at a primary-side switch of the power converter, thereby discharging energy stored by a parasitic capacitance of the primary-side switch to reduce a drain-source voltage of the primary-side switch. The primary-side switch is thereafter transitioned to an ON-state having zero or near to zero voltage developed across the primary-side switch, advantageously reducing switching losses of the power converter.

Power converters, such as flyback converters, often include a transformer that galvanically isolates a primary-side of the power converter from a secondary-side of the power converter. In such power converters, a primary-side switch of the power converter controls a flow of current through a primary-side winding of the transformer to charge a magnetizing inductance of the transformer. A synchronous rectifier switch on the secondary-side of the power converter controls a flow of output current from a secondary-side winding of the transformer to discharge the energy stored in the magnetizing inductance of the transformer, thereby transferring power to a load of the power converter. In general, the synchronous rectifier switch is in an OFF-state during a time period that the primary-side switch is in an ON-state, and the synchronous rectifier switch is generally in an ON-state for a portion of the time that the primary-side switch is in an OFF-state.

During a time period that the synchronous rectifier switch is in an ON-state, output current from the secondary winding flows to an output of the power converter. Corresponding to the flow of output current, a magnetizing inductance current of the transformer decreases to zero as energy stored in the magnetizing inductance is discharged. If the synchronous rectifier switch remains in an ON-state after the magnetizing inductance current reaches zero, the magnetizing inductance current becomes negative, at which point the magnetizing inductance current will commence discharging a charged parasitic output capacitance Coss of the primary-side switch. As the output capacitance of the primary-side switch is discharged, a drain-source voltage of the primary-side switch is reduced. By controlling how long the negative magnetizing inductance current flows through the primary winding before the synchronous rectifier switch is transitioned to an OFF-state, the primary-side switch can advantageously attain zero-volt switching (ZVS) or near ZVS. By utilizing ZVS or near ZVS of the primary-side switch, switching losses of the primary-side switch are reduced and power processing efficiency of the power converter is increased as compared to a power converter that does not implement ZVS or near ZVS.

As disclosed herein, the synchronous rectifier controller advantageously auto-tunes the duration of time that the synchronous rectifier switch remains in the ON-state after the magnetizing inductance current has transitioned to a negative current flow to control the discharge amount of the output capacitance Coss of primary-side switch without a priori information regarding an inductance of the transformer, without primary-side measurements of voltage or current, and without receiving control signals from a primary-side controller of the power converter. Because the synchronous rectifier controller is advantageously communicatively isolated from the primary-side of the power converter, design of the power converter is simplified and existing power converter designs may make use of the synchronous rectifier controller disclosed herein without requiring changes to be made to the primary side controller.

Additionally, as compared to conventional solutions, some embodiments disclosed herein advantageously transition the primary-side switch to an ON-state before the drain-source voltage reaches zero volts, thereby achieving near zero-volt switching of the primary-side switch. By utilizing near ZVS switching, such embodiments advantageously mitigate the risk of a negative current developing through the primary-side switch, thereby reducing the risk of damaging the primary-side switch.

FIG. 1 is a simplified circuit schematic of a flyback power converter ("power converter") 100, in accordance with some embodiments. Some elements of the power converter 100 have been omitted from FIG. 1 to simplify the description of the power converter 100 but are understood to be present. In general, the power converter 100 includes a primary-side (i.e., an input) configured to receive an input voltage Vin', and a secondary-side (i.e., an output) configured to provide an output voltage Vout at the node 124 using the input voltage Vin'. The primary-side is coupled to the secondary-side by a transformer 102. The transformer 102 transfers power from the primary-side of the power converter 100 to the secondary-side of the power converter 100 and generally includes a primary winding 104 and a secondary winding 106. The primary-side of the power converter 100 generally includes the primary winding 104 of the transformer 102, an input voltage filter block 115, a rectifier block 116 (in the case of AC input), an input voltage buffer capacitor C1, a primary-side switch M1 directly electrically connected to a node 110 of the primary winding 104, and a power converter controller ("controller") 118. A magnetizing inductance $L_M$ of the transformer 102 is illustrated as a winding 105. A compensator 117 is part of a control/feedback path from the secondary-side of the power converter 100 to the primary-side of the power converter 100 and is, thus, part of both the primary-side and the secondary-side. The secondary-side of the power converter 100 generally includes the secondary winding 106 of the transformer 102, an output buffer circuit 112, a synchronous rectifier switch M2 having a body diode, and a synchronous rectifier controller 120. The synchronous rectifier switch M2 is directly electrically connected to the secondary winding 106 at a node 121. As shown, an output of the power converter 100 is configured to be connected to a load $R_L$. The feedback path through the compensator 117 provides a measurement based on the output voltage Vout to the controller 118. Also shown are nodes 107, 111, 122, and 123. Signals related to operation of the power converter 100 illustrated in FIG. 1 include a primary-side switch control signal $GATE_{M1}$, a power converter feedback signal FB, the input voltage Vin', a buffered, filtered, or otherwise conditioned input voltage Vin at the node 111, a magnetizing inductance current $i_{LM}$, a primary-side switch current $i_{M1}$, a drain-source voltage $V_{M1}$ at a drain node of the primary-side switch M1 (at the node 110), an output current iout of the power converter 100, a synchronous rectifier switch control signal $GATE_{M2}$, a synchronous rectifier switch drain-source voltage $V_{M2}$ at a drain node of the synchronous rectifier switch M2, a synchronous rectifier switch current $i_{SR}$ through the synchronous rectifier switch M2, and a received, indicated, or sampled synchronous rectifier switch current $i_{M2}$ that is indicative of the synchronous rectifier switch current $i_{SR}$.

The voltage Vin' is received at the power converter 100 as an alternating current (AC) or direct current (DC) voltage. The input voltage filter block 115, the rectifier block 116, and the input buffer capacitor C1 provide the filtered, buffered, rectified, or otherwise conditioned input voltage Vin to the transformer 102 at the node 111. The primary winding 104 receives the input voltage Vin at the node 111. The primary winding 104 is directly electrically connected in series to the drain node of the primary-side switch M1, and a source node of the primary-side switch M1 is electrically coupled to a voltage bias node such as ground. The primary-side switch M1 is controlled at a gate node by the primary-side switch control signal $GATE_{M1}$ (e.g., a pulse-width-modulation (PWM) signal) generated by the controller 118. The primary-side switch M1 controls, in response to the primary-side switch control signal $GATE_{M1}$, the current $i_{M1}$ through the primary winding 104 to charge the magnetizing inductance $L_M$ 105 (as illustrated by the magnetizing inductance current $i_{LM}$) of the transformer 102 during a first portion of a switching cycle of the power converter 100 (i.e., during an on-time of the primary-side switch M1). The synchronous rectifier switch M2 controls a current flow through the secondary winding 106 to discharge energy stored by the transformer 102 into the output buffer circuit 112 and the load $R_L$ during a subsequent portion of the switching cycle (i.e., during an off-time of the primary-side switch M1).

To elaborate, when the primary-side switch M1 is enabled by the controller 118 during the first portion of the switching cycle, current flows through the primary winding 104 to the voltage bias node. The current flow through the primary winding 104 causes energy to be stored in the magnetizing inductance $L_M$ 105 and a leakage inductance $L_L$ (not shown) of the transformer 102. When the primary-side switch M1 is disabled in the subsequent portion of the switching cycle, the output voltage Vout is generated at the output buffer circuit 112 and is provided to the load $R_L$. The compensator 117 receives the generated output voltage Vout at the node 107 and uses the output voltage Vout to generate the feedback signal FB which is used to adjust an on-time of the primary-side switch M1.

The synchronous rectifier switch M2 provides rectification on the secondary-side of the power converter 100. When the primary-side switch M1 is in an ON-state, the synchronous rectifier switch M2 is in an OFF-state. After the primary-side switch M1 transitions to an OFF-state, the synchronous rectifier switch M2 transitions to an ON-state. During a time period that the synchronous rectifier switch M2 is in an ON-state, the output current iout flows from the secondary winding 106 to the output buffer circuit 112 and to the load $R_L$. Corresponding to the flow of output current iout, the synchronous rectifier switch current $i_{SR}$ flows through the synchronous rectifier switch M2. As the output current iout flows from the secondary winding 106, the magnetizing inductance current $i_{LM}$ flow decreases to zero. If the synchronous rectifier switch M2 remains in an ON-state after the magnetizing inductance current $i_{LM}$ reaches zero, the magnetizing inductance current $i_{LM}$ becomes negative, at which point the magnetizing inductance current $i_{LM}$ will commence discharging a charged parasitic output capacitance Coss of the primary-side switch M1. As the output capacitance Coss of the primary-side switch M1 is discharged, the drain-source voltage $V_{M1}$ of the primary-side switch M1 is reduced. Thus, by controlling how long the negative magnetizing inductance current $i_{LM}$ flows through the primary winding 104 before the synchronous rectifier switch M2 is transitioned to an OFF-state, the primary-side switch M1 can be advantageously transitioned to the ON-state when the drain-source voltage $V_{M1}$ is at or near zero volts, thereby achieving zero-volt switching (ZVS) or near ZVS of the primary-side switch M1. By using ZVS or near ZVS of the primary-side switch M1, switching losses of the primary-side switch M1 are reduced and a power processing efficiency of the power converter 100 is increased as compared to a power converter that does not implement ZVS or near ZVS.

As compared to conventional solutions, some embodiments disclosed herein advantageously transition the primary-side switch M1 to an ON-state before the drain-source voltage $V_{M1}$ reaches zero volts, thereby achieving near zero-volt switching of the primary-side switch M1. By utilizing near ZVS switching, such embodiments advantageously mitigate the risk of a negative current developing through the primary-side switch M1, which reduces the risk of damaging the primary-side switch M1 as compared to conventional solutions. Additionally, as disclosed herein, the synchronous rectifier controller 120 advantageously auto-tunes the duration of time that the synchronous rectifier switch M2 remains in the ON-state after the magnetizing inductance current $i_{LM}$ has transitioned to a negative current flow to control the discharge amount of the output capacitance Coss of primary-side switch M1.

The synchronous rectifier controller 120, as shown, is communicatively isolated from the primary-side of the power converter 100, which includes the controller 118 and the primary-side switch M1. Because the synchronous rectifier controller 120 is communicatively isolated from the primary-side of the power converter 100, the synchronous rectifier controller 120 does not receive timing signals, control signals, indications of voltage, or indications of current from the primary-side of the power converter 100.

Thus, the synchronous rectifier controller 120, as disclosed herein, advantageously does not use primary-side measurements or primary-side control signals to perform auto-tuning of the synchronous switch M2.

Figure 2:
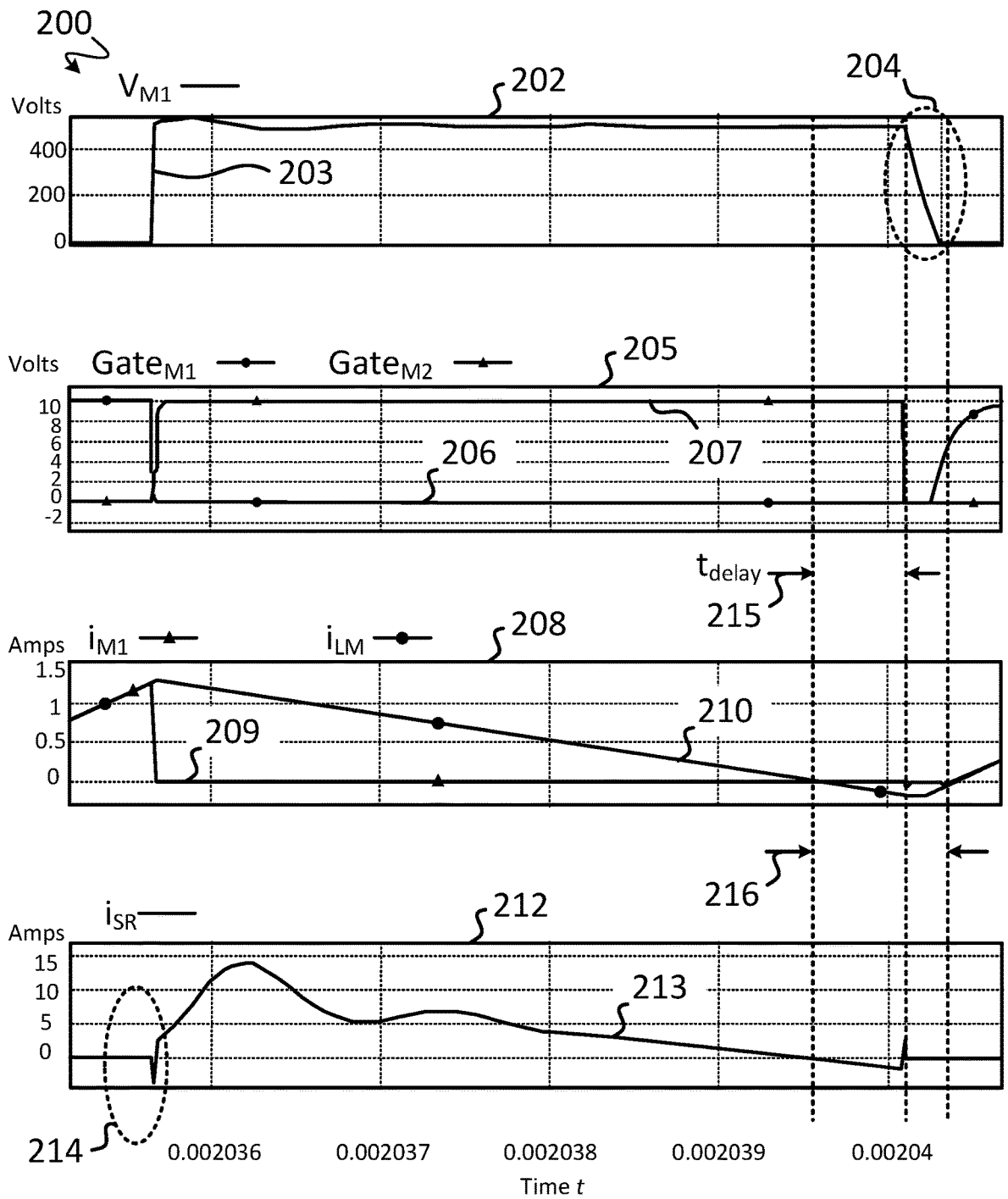
FIG. 2 show simplified plots of signals related to operation of the power converter shown in FIG. 1, in accordance with some embodiments.

FIG. 2 show simplified plots 200 of signals related to operation of the power converter 100 shown in FIG. 1 over a sample period during time t, in accordance with some embodiments. Plot 202 includes a plot of the drain-source voltage $V_{M1}$ 203 of the primary-side switch M1 over time t, and a first region of interest 204. Plot 205 includes a plot of the primary-side switch control signal $GATE_{M1}$ 206 and a plot of the synchronous rectifier switch control signal $GATE_{M2}$ 207 over time t. Plot 208 includes a plot of the primary-side switch current $i_{M1}$ 209 and a plot of the magnetizing inductance current $i_{LM}$ 210 over time t. Plot 212 includes a plot of the synchronous rectifier switch current $i_{SR}$ 213 over time t, and a second region of interest 214. Also shown is, an example duration of an auto-tuned delay $t_{delay}$ 215, and a duration of negative magnetizing inductance current 216.

At the beginning of the sample period shown at the far left of the plots 200, the primary-side switch M1 is in an ON-state, as illustrated by an asserted level of the primary-side switch control signal $GATE_{M1}$ 206. Concurrently, the synchronous rectifier switch M2 is in an OFF-state, as illustrated by a de-asserted level of the synchronous rectifier switch control signal $GATE_{M2}$ 207. During the time that the primary-side switch M1 is on and the synchronous rectifier switch M2 is off, the primary-side switch current $i_{M1}$ 209 and the magnetizing inductance current $i_{LM}$ 210 increase as the magnetizing inductance $L_M$ 105 of the transformer 102 is charged. When the primary-side switch control signal $GATE_{M1}$ 206 is de-asserted, the primary-side switch M1 transitions to an OFF-state and the primary-side switch current $i_{M1}$ 209 quickly falls to zero. Shortly thereafter, body diode conduction of the synchronous rectifier switch M2 occurs, as illustrated at the second region of interest 214. Upon detecting, by the synchronous rectifier controller 120, that body diode conduction of the synchronous rectifier switch M2 is occurring or has occurred, the synchronous rectifier controller 120 transitions the synchronous rectifier switch M2 to an ON-state, as shown in the plot 205. Accordingly, the synchronous rectifier switch current $i_{SR}$ 213 rises and the magnetizing inductance current $i_{LM}$ 210 decreases as energy stored in the magnetizing inductance $L_M$ 105 of the transformer 102 is discharged into the load $R_L$. During the time period that the synchronous rectifier switch M2 remains in an ON-state, the magnetizing inductance current $i_{LM}$ 210 continues to decrease. Within the region 216, the magnetizing inductance current $i_{LM}$ 210 and the synchronous rectifier switch current $i_{SR}$ 213 both become negative. When the synchronous rectifier switch current $i_{SR}$ 213 transitions to a negative current (i.e., changes direction), the auto-tuned delay $t_{delay}$ 215 is commenced by the synchronous rectifier controller 120. During the time that the magnetizing inductance current $i_{LM}$ 210 is negative, as illustrated by the region 216, charge stored by the parasitic capacitance Coss of the primary-side switch M1 is discharged. As illustrated at the first region of interest 204, discharging the parasitic capacitance Coss of the primary-side switch M1 ultimately reduces the drain-source voltage $V_{M1}$ 203 of the primary-side switch M1. After an expiration of the auto-tuned delay $t_{delay}$ 215, the synchronous rectifier switch M2 is transitioned to an OFF-state. Thereafter, the primary-side switch M1 is transitioned back to an ON-state. Thus, by advantageously controlling a duration of the auto-tuned delay $t_{delay}$ 215, a corresponding forced duration of negative magnetizing inductance current $i_{LM}$ 210 (within the region 216) discharges energy stored by the parasitic capacitance Coss of the primary-side switch M1. Discharging energy stored by the parasitic capacitance Coss of the primary-side switch M1 reduces the drain-source voltage $V_{M1}$ 203 of the primary-side switch M1 to zero, or near zero (i.e., a value greater than zero volts), before the primary-side switch M1 is transitioned to an ON-state, as illustrated at the first region of interest 204.

If the duration of the auto-tuned delay $t_{delay}$ 215 is shorter than an optimal value, the primary-side switch M1 might be transitioned to an ON-state when the drain-source voltage $V_{M1}$ 203 is still substantially greater than zero, thereby causing switching losses which decrease a power processing efficiency of the power converter 100. However, if the duration of the auto-tuned delay $t_{delay}$ 215 is too long, a negative current may develop through the primary-side switch which could potentially damage the primary-side switch M1. Thus, as disclosed herein, the synchronous rectifier controller 120 advantageously auto-tunes the duration of the auto-tuned delay $t_{delay}$ 215 to achieve an optimal duration.

Figure 3:
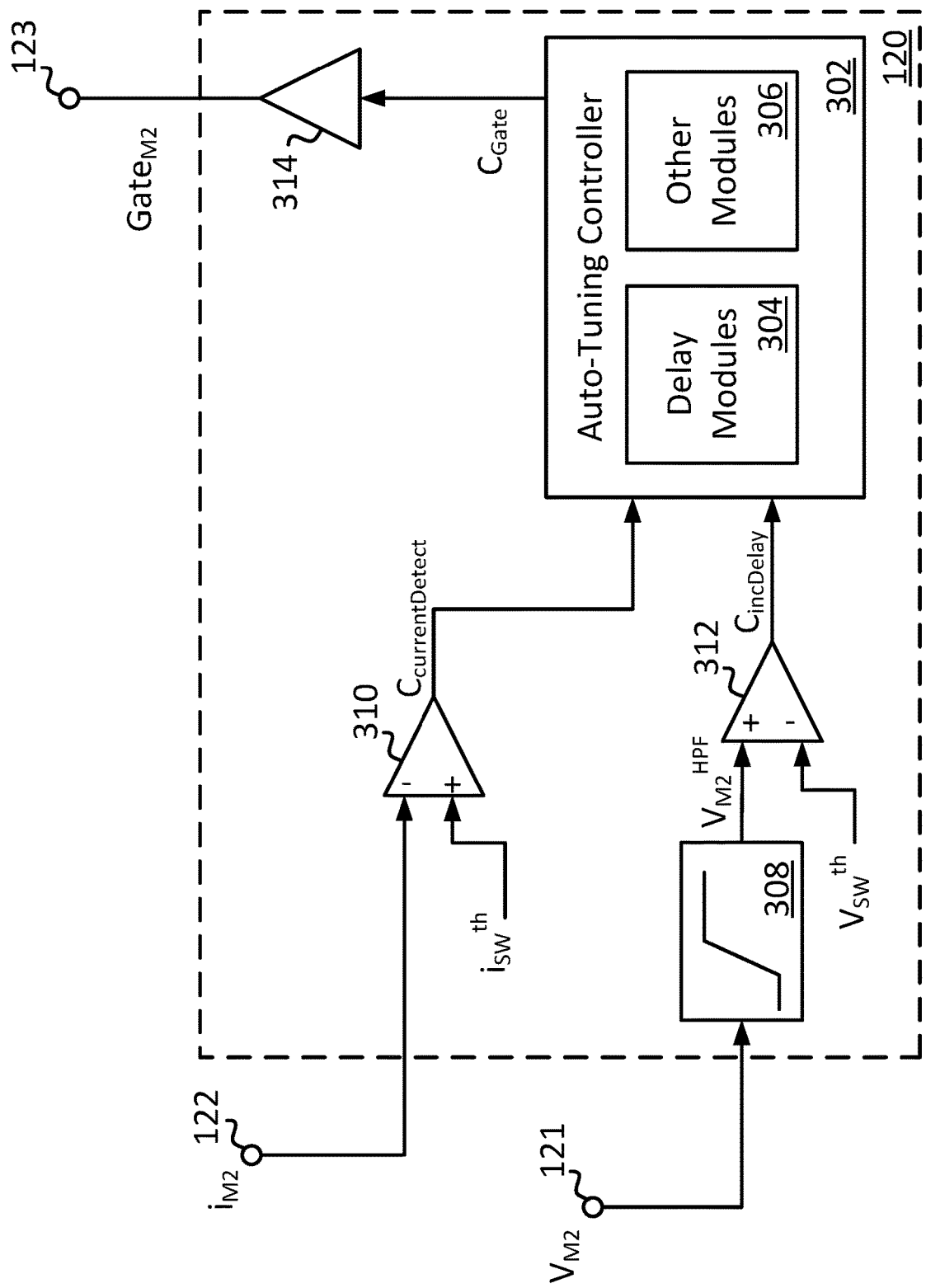
FIG. 3 is a simplified circuit schematic of a synchronous rectifier controller for use in the power converter shown in FIG. 1, in accordance with some embodiments.

FIG. 3 is a simplified circuit schematic providing details of the synchronous rectifier controller 120 of the power converter 100, in accordance with some embodiments. Some elements of the synchronous rectifier controller 120 have been omitted from FIG. 3 to simplify the description of the synchronous rectifier controller 120 but are understood to be present. In general, the synchronous rectifier controller 120 includes an auto-tuning controller 302 that generally includes delay modules 304 and other modules 306 (e.g., timing and control logic, counter circuits, general processors, programmable logic circuits, a look-up table, and/or other circuits), a high-pass filter circuit 308, a current comparison circuit 310, a voltage comparison circuit 312, and a gate driver circuit 314. Also shown are the nodes 121, 122, and 123 previously described with reference to FIG. 1. In some embodiments, all or a portion of one or more of the components 308, 310, 312, and/or 314 are located outside of an integrated circuit that implements the synchronous rectifier controller 120.

Signals related to operation of the synchronous rectifier controller 120 include the sampled synchronous rectifier switch current $i_{M2}$ at the node 122, the synchronous rectifier switch drain-source voltage $V_{M2}$ at the node 121, the synchronous rectifier switch control signal $GATE_{M2}$ at the node 123, a current threshold value $i_{sw}^{th}$ at a non-inverting node of the current comparison circuit 310, a voltage threshold value $V_{sw}^{th}$ at an inverting node of the voltage comparison circuit 312, a high-pass filtered drain-source voltage $V_{M2}^{HPF}$ produced by the high-pass filter circuit 308, a current comparison signal $C_{currentDetect}$ produced by the current comparison circuit 310, a voltage comparison signal $C_{incDelay}$ produced by the voltage comparison circuit 312, and a gate control signal $C_{Gate}$ produced by the auto-tuning controller 302.

In some embodiments, the sampled synchronous rectifier switch current $i_{M2}$, received at an inverting input of the current comparison circuit 310, is equal to the synchronous rectifier switch current $i_{SR}$. In other embodiments, the sampled synchronous rectifier switch current $i_{M2}$ is proportional to the synchronous rectifier switch current $i_{SR}$. In yet other embodiments, the sampled synchronous rectifier switch current $i_{M2}$ is a signal that is indicative of the synchronous rectifier switch current $i_{SR}$ (e.g., a voltage, or a digital signal). The current threshold value $i_{sw}^{th}$ is an appropriate signal for comparison against the sampled synchronous rectifier switch current $i_{M2}$. In some embodiments, the current threshold value $i_{sw}^{th}$ is equal to, is proportional to, or is representative of zero amps.

The high-pass filter circuit 308 is an analog or digital filter circuit configured to receive the synchronous rectifier switch drain-source voltage $V_{M2}$, or a signal indicative of the synchronous rectifier switch drain-source voltage $V_{M2}$ (e.g., a digital signal, or a proportional signal). The high-pass filter circuit 308 is operable to substantially attenuate frequency components of the synchronous rectifier switch drain-source voltage $V_{M2}$ that are less than a non-zero frequency cut-off value (e.g., 5 MHz), and pass frequency components of the synchronous rectifier switch drain-source voltage $V_{M2}$ that are greater than the non-zero frequency cut-off value. Thus, the high-pass filtered drain-source voltage $V_{M2}^{HPF}$ signal, received at a non-inverting input of the voltage comparison circuit 312, is representative of frequency components (i.e., an instantaneous voltage component) of the synchronous rectifier switch drain-source voltage $V_{M2}$ that are higher in frequency than the non-zero frequency cut-off value.

In some embodiments, a value for the voltage threshold value $V_{sw}^{th}$ used for comparison against the high-pass filtered drain-source voltage $V_{M2}^{HPF}$ signal is chosen based on the desired near ZVS valley voltage as seen on secondary side, i.e., Valley/n, where n is the primary to secondary transformer turns-ratio. In some embodiments, the voltage threshold value $V_{sw}^{th}$ is equal to 2-5 volts, equivalent to valley voltage of 10-30V.

In some embodiments, the gate control signal $C_{Gate}$ produced by the auto-tuning controller 302 is a digital signal configured to control an output of the gate driver circuit 314. The gate driver circuit 314 level-shifts, buffers, amplifies, or otherwise conditions the gate control signal $C_{Gate}$ to generate the synchronous rectifier switch control signal $GATE_{M2}$.

Operation of the synchronous rectifier controller 120 is described at a high level by an example process 400 illustrated in FIG. 4, in accordance with some embodiments. The particular steps, order of steps, and combination of steps are shown in FIG. 4 for illustrative and explanatory purposes only. Other embodiments can implement different particular steps, orders of steps, and combinations of steps to achieve similar functions or results. The steps of FIG. 4 are described with reference to the power converter 100 of FIG. 1, relevant signals of the plots 200 of FIG. 2, and details of the synchronous rectifier controller 120 shown in FIG. 3.

At step 401, as an initial start condition of the process 400, the synchronous rectifier switch M2 is in an OFF-state and the primary-side switch M1 has transitioned from the ON-state to an OFF-state. At step 402, it is determined, e.g., using the current comparison circuit 310, if body diode conduction of the synchronous rectifier switch M2 is or has been detected. For example, if the synchronous rectifier switch current $i_{SR}$ transitions from a non-zero or zero current level to a negative current level due to body diode conduction of the synchronous rectifier switch M2, as shown at the first region of interest 214 in FIG. 2, the sampled synchronous rectifier switch current $i_{M2}$ will correspondingly attain a value that is less than the current threshold value $i_{sw}^{th}$.

If it is not determined at step 402 that body diode conduction of the synchronous rectifier switch M2 is or has been detected, flow of the process 400 remains at step 402. However, upon determining that the sampled synchronous rectifier switch current $i_{M2}$ is less than the current threshold value $i_{sw}^{th}$, the current comparison circuit 310 generates an asserted current comparison signal $C_{currentDetect}$. Upon receiving the asserted current comparison signal $C_{currentDetect}$ at the auto-tuning controller 302 when the synchronous rectifier switch M2 is in an OFF-state, it is determined at step 402 that body diode conduction of the synchronous rectifier switch M2 has occurred and flow continues to step 404.

At step 404, the synchronous rectifier switch M2 is transitioned to an ON-state by the auto-tuning controller 302 by transmitting an asserted gate control signal $C_{Gate}$ to the gate driver circuit 314. Upon receiving the asserted gate control signal $C_{Gate}$, the gate driver circuit 314 transmits a level-shifted, buffered, amplified, or otherwise conditioned synchronous rectifier gate control signal Gate to a gate node of the synchronous rectifier switch M2 to transition the synchronous rectifier switch M2 to the ON-state.

During the time that the synchronous rectifier switch M2 is in the ON-state, the primary-side switch M1 remains in the OFF-state, and energy stored in the magnetizing inductance $L_M$ 105 of the transformer 102 is discharged (as shown in the plot 208). As the output current iout flows from the transformer 102 to the output buffer circuit 112 and the load $R_L$, a corresponding synchronous rectifier switch current $i_{SR}$ flows through the synchronous rectifier switch M2, as shown in the plot 212, and a proportional, representative, or identical sampled synchronous rectifier switch current $i_{M2}$ is received at an inverting node of the current comparison circuit 310.

As was shown in the plots 208 and 212, the amplitudes of the magnetizing inductance current $i_{LM}$ and the synchronous rectifier switch current $i_{SR}$ respectively decrease to zero as the magnetizing inductance $L_M$ 105 of the transformer 102 is discharged, eventually reaching and crossing through an amplitude of zero at the beginning of the region 216, thereby changing direction. At step 406, it is determined using the current comparison circuit 310 if the synchronous rectifier switch current $i_{SR}$ has changed directions (i.e., is of a negative amplitude). If it is not determined at step 406 that the synchronous rectifier switch current $i_{SR}$ has changed directions, flow of the process 400 remains at step 406. However, if it is determined at step 406 that the sampled synchronous rectifier switch current $i_{M2}$ is less than the current threshold value $i_{sw}^{th}$, the current comparison circuit 310 generates an asserted current comparison signal $C_{currentDetect}$. Upon receiving the asserted current comparison signal $C_{currentDetect}$ when the synchronous rectifier switch M2 is in an ON-state, flow of the process 400 continues to step 408.

At step 408, the auto-tuning controller 302 commences an auto-tuned delay (e.g., $t_{delay}$ 215 shown in FIG. 2). In some embodiments, commencing the auto-tuned delay $t_{delay}$ involves initializing one or more timing or delay modules of the delay modules 304 of the auto-tuning controller 302. In some embodiments, the auto-tuned delay $t_{delay}$ is commenced by initializing a delay module of the delay modules 304 to zero and the auto-tuned delay $t_{delay}$ expires when that delay module of the delay modules 304 determines that a time equal to the auto-tuned delay $t_{delay}$ has elapsed. In other embodiments, the auto-tuned delay $t_{delay}$ is commenced by initializing a delay module of the delay modules 304 to a value corresponding to the auto-tuned delay $t_{delay}$ and the auto-tuned delay $t_{delay}$ expires when that delay module determines that a time equal to the auto-tuned delay $t_{delay}$ has elapsed.

After the auto-tuned delay $t_{delay}$ has commenced, and before the auto-tuned delay $t_{delay}$ has expired, the synchronous rectifier switch M2 remains in an ON-state and a forced negative magnetizing inductance current $i_{LM}$ advantageously discharges energy stored by the parasitic capacitance Coss of the primary-side switch M1, as shown within the region representative of the auto-tuned delay $t_{delay}$ 215 of FIG. 2.

At step 410, the auto-tuning controller 302 determines (e.g., using the delay modules 304) if the auto-tuned delay has expired. If it is not determined at step 410 that the auto-tuned delay $t_{delay}$ has expired, flow of the process 400 remains at step 410 and the synchronous rectifier switch M2 remains in an ON-state. If it is determined by the auto-tuning controller 302 at step 410 that the auto-tuned delay $t_{delay}$ has expired, flow continues to step 412. At step 412, the synchronous rectifier switch M2 is transitioned to an OFF-state by the auto-tuning controller 302 (e.g., by generating a de-asserted $C_{Gate}$ control signal). At step 414, the auto-tuned delay $t_{delay}$ is updated (i.e., "tuned") by increasing, decreasing, or maintaining a duration of delay indicated by the auto-tuned delay $t_{delay}$.

In general, the auto-tuned delay $t_{delay}$ is updated based on a rate of change of the drain-source voltage $V_{M2}$ of the synchronous rectifier switch M2 after the synchronous rectifier switch M2 is transitioned to an OFF-state. As previously described, an instantaneous voltage component of drain-source voltage $V_{M2}$ is indicated by the high-pass filtered drain-source voltage $V_{M2}^{HPF}$. If the instantaneous voltage component of drain-source voltage $V_{M2}$ quickly increases to a peak value after the synchronous rectifier switch M2 is transitioned to an OFF-state, the duration of delay indicated by the auto-tuned delay $t_{delay}$ is increased in order to increase the negative magnetizing inductance current $i_{LM}$, thereby increasing the amount of energy discharged from the parasitic capacitance Coss of the primary-side switch M1 during the next switching cycle. If, instead, the instantaneous voltage component of the drain-source voltage $V_{M2}$ slowly increases to a peak value after the synchronous rectifier switch M2 is transitioned to an OFF-state, the duration of delay indicated by the auto-tuned delay $t_{delay}$ is decreased. By decreasing the duration of delay indicated by the auto-tuned delay $t_{delay}$, the duration of negative magnetizing inductance current $i_{LM}$ is correspondingly decreased, thereby decreasing the amount of energy discharged from the parasitic capacitance Coss of the primary-side switch M1 such that a maximum discharge amount of the parasitic capacitance Coss is less than a full discharge amount (e.g., to prevent a potentially damaging negative current through the primary-side switch M1 from occurring). Thus, the synchronous rectifier controller 120 advantageously determines an optimal duration of forced magnetizing inductance current $i_{LM}$ to achieve ZVS or near-ZVS of the primary-side switch M1 without receiving primary-side measurements or control signals of the power converter 100 and without requiring a priori indications of an inductance of the transformer 102. As such, an existing power converter design can be easily and affordably modified to include the synchronous rectifier controller 120.

Figure 5A:
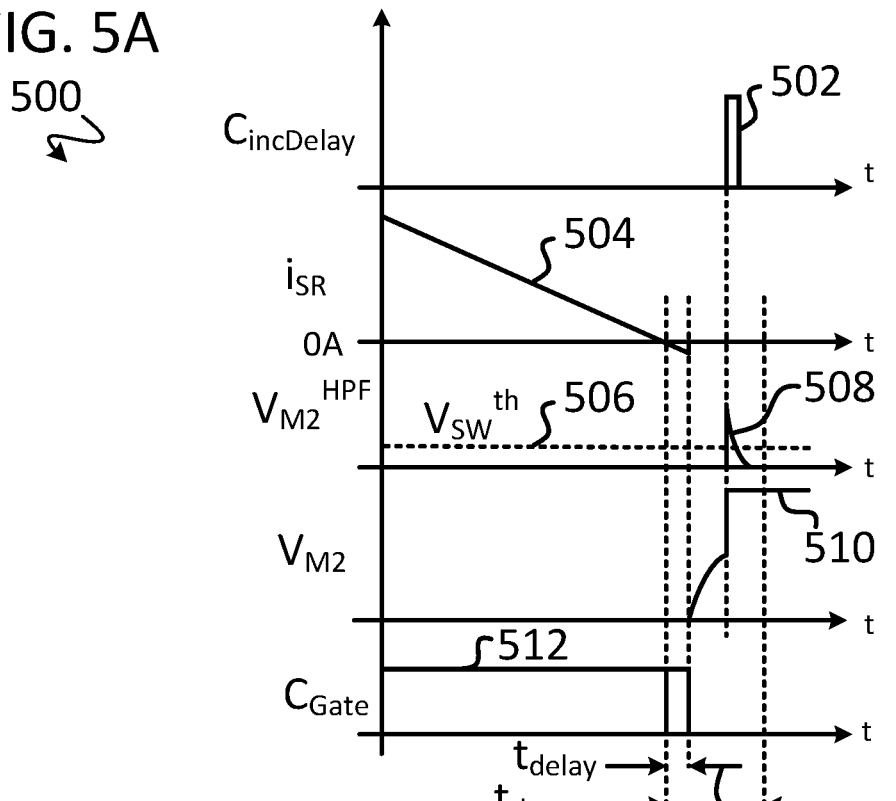
FIGS. 5A-B show simplified plots of signals related to operation of the power converter shown in FIG. 1, in accordance with some embodiments.
Figure 5B:
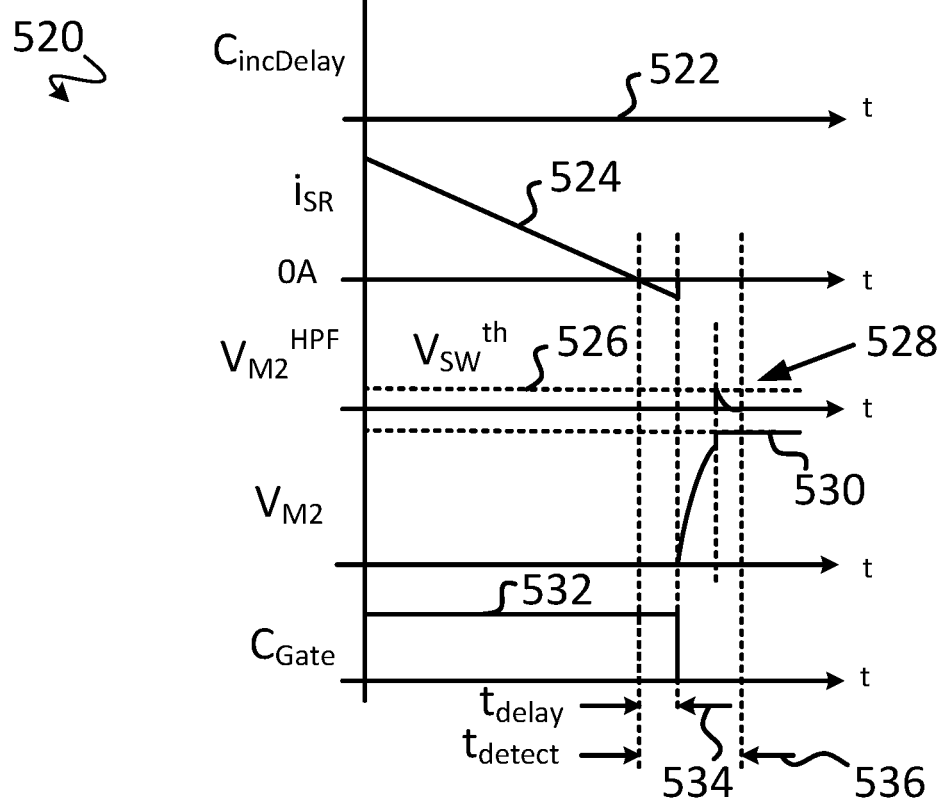
Figure 6:
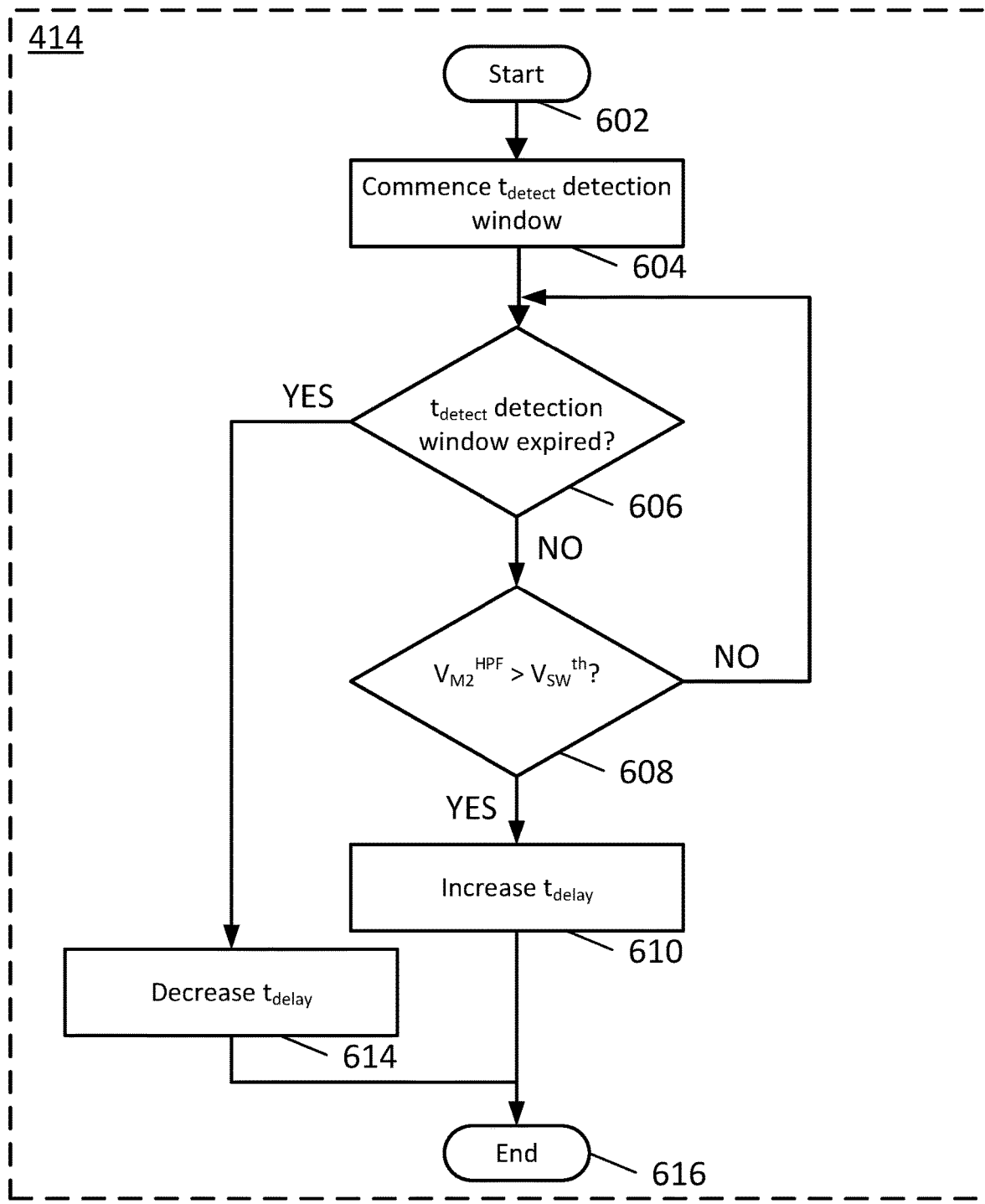
FIG. 6 is a portion of the example process of FIG. 4 for operation of the synchronous rectifier controller shown in FIG. 3, in accordance with some embodiments.

Additional details regarding step 414 are described with respect to FIGS. 5A-6. FIG. 5A shows simplified plots 500 of signals related to operation of the power converter 100 shown in FIG. 1 and details of the synchronous rectifier controller 120 shown in FIG. 3 over time t, in accordance with some embodiments. Plot 500 includes a plot of the voltage comparison signal $C_{incDelay}$ 502, a plot of the synchronous rectifier switch current $i_{SR}$ 504, a plot of the voltage threshold value $V_{sw}^{th}$ 506, a plot of the high-pass filtered drain-source voltage $V_{M2}^{HPF}$ 508, a plot of the synchronous rectifier switch drain-source voltage $V_{M2}$ 510, and a plot of the synchronous rectifier switch M2 gate control signal $C_{Gate}$ 512 over time t. Also shown is a plot of an example duration of the auto-tuned delay $t_{delay}$ 514 and a plot of an example duration of a detection window $t_{detect}$ 516. The example shown in the plots 500 generally illustrates a portion of a switching cycle of the synchronous rectifier switch M2, occurring at step 414 of the process 400, in which the instantaneous voltage component (i.e., $V_{M2}^{HPF}$ 508) of the drain-source voltage $V_{M2}$ 510 of the synchronous rectifier switch M2 quickly increases to a peak value after the synchronous rectifier switch M2 is transitioned to an OFF-state, thereby exceeding the voltage threshold value $V_{sw}^{th}$ 506 before an expiration of the detection window $t_{detect}$ 516. Accordingly, the duration of delay indicated by the auto-tuned delay $t_{delay}$ is increased, as triggered by an asserted level of the voltage comparison signal $C_{incDelay}$ 502, in order to increase a duration of forced negative magnetizing inductance current $i_{LM}$.

FIG. 5B shows simplified plots 520 of signals related to operation of the power converter 100 shown in FIG. 1 and details of the synchronous rectifier controller 120 shown in FIG. 3 over time t, in accordance with some embodiments. Plot 520 includes a plot of the voltage comparison signal $C_{incDelay}$ 522, a plot of the synchronous rectifier switch current $i_{SR}$ 524, a plot of the voltage threshold value $V_{sw}^{th}$ 526, a plot of the high-pass filtered drain-source voltage $V_{M2}^{HPF}$ 528, a plot of the synchronous rectifier switch drain-source voltage $V_{M2}$ 530, and a plot of the gate control signal $C_{Gate}$ 532 over time t. Also shown is a plot of an example duration of the auto-tuned delay $t_{delay}$ 534 and a plot of an example duration of the detection window $t_{detect}$ 536. The example shown in the plots 520 generally illustrates a portion of the switching cycle of the synchronous rectifier switch M2, occurring at step 414 of the process 400, in which the instantaneous voltage component (i.e., $V_{M2}^{HPF}$ 528) of the drain-source voltage $V_{M2}$ 530 does not quickly increase to a peak value after the synchronous rectifier switch M2 is transitioned to an OFF-state, and therefore does not exceed the voltage threshold value $V_{sw}^{th}$ 526 before an expiration of the detection window $t_{detect}$ 536. Accordingly, the duration of delay indicated by the auto-tuned delay $t_{delay}$ 534 is decreased, as triggered by a de-asserted level of the voltage comparison signal $C_{incDelay}$ 522, in order to decrease a duration of forced negative magnetizing inductance current $i_{LM}$.

Details of step 414 of the process 400 are illustrated in FIG. 6. The particular steps, order of steps, and combination of steps are shown in FIG. 6 for illustrative and explanatory purposes only. Other embodiments can implement different particular steps, orders of steps, and combinations of steps to achieve similar functions or results. The steps of FIG. 6 are described with respect to the power converter 100 of FIG. 1, details of the synchronous rectifier controller 120 shown in FIG. 3, and relevant signals of the plots 500 and 520 of FIGS. 5A-B.

At step 602, as an initial start condition of step 414, the primary-side switch M1 is in an OFF-state and the synchronous rectifier switch M2 has transitioned from the ON-state to an OFF-state (i.e., at step 412 of FIG. 4). At step 604, a detection window of time (e.g., $t_{detect}$ 516/536) is commenced. In some embodiments, commencing the detection window $t_{detect}$ involves initializing one or more timing or delay modules of the delay modules 304 of the auto-tuning controller 302. In some embodiments, the detection window $t_{detect}$ is commenced by initializing a delay module of the delay modules 304 to zero and the detection window $t_{detect}$ expires when that delay module determines that a time equal to the detection window $t_{detect}$ has elapsed. In other embodiments, the detection window $t_{detect}$ is commenced by initializing a delay module of the delay modules 304 to a value corresponding to the detection window $t_{detect}$ and the detection window $t_{detect}$ expires when that delay module determines that a time equal to the detection window $t_{detect}$ has elapsed. In general, the detection window (e.g., $t_{detect}$ 516/536) is set to a value based on a maximum quasi-resonant half-period. In some embodiments, the detection window $t_{detect}$ is equal to 100 ns (e.g., for a >=300 Mhz switching frequency) or 1000 us (e.g., for a <300 kHz switching frequency).

At step 606, it is determined if the detection window $t_{detect}$ has expired. If it is determined at step 606 that the detection window $t_{detect}$ has not yet expired, flow continues to step 608. At step 608, it is determined if the high-pass filtered drain-source voltage $V_{M2}^{HPF}$ of the synchronous rectifier switch drain-source voltage $V_{M2}$ (i.e., an instantaneous voltage component) is greater than the voltage threshold value $V_{sw}^{th}$. If it is determined at step 608 that the high-pass filtered drain-source voltage $V_{M2}^{HPF}$ of the synchronous rectifier switch drain-source voltage $V_{M2}$ is greater than the voltage threshold value $V_{sw}^{th}$ (e.g., as shown in plot 500 where the high-pass filtered drain-source voltage $V_{M2}^{HPF}$ 508 crosses above the voltage threshold value $V_{sw}^{th}$ 506), an asserted voltage comparison signal $C_{incDelay}$ 502 is generated by the voltage comparison circuit 312, as shown in the plots 500, and flow continues to step 610. At step 610, the delay indicated by the auto-tuned delay $t_{delay}$ is increased by the auto-tuning controller 302 in response to receiving the asserted voltage comparison signal $C_{incDelay}$ 502. If it is not determined at step 608 that the high-pass filtered drain-source voltage $V_{M2}^{HPF}$ of the synchronous rectifier switch drain-source voltage $V_{M2}$ is greater than the voltage threshold value $V_{sw}^{th}$, flow returns to step 606. At step 606, if it is determined that the detection window $t_{detect}$ has expired (i.e., without having determined that the high-pass filtered drain-source voltage $V_{M2}^{HPF}$ of the synchronous rectifier switch drain-source voltage $V_{M2}$ is greater than the voltage threshold value $V_{sw}^{th}$), the delay indicated by the auto-tuned delay $t_{delay}$ is decreased by the auto-tuning controller 302. Flow from either of steps 610 or 614 proceed to step 616, which concludes the illustrated portion of step 414 of the process 400.

Figure 7A:
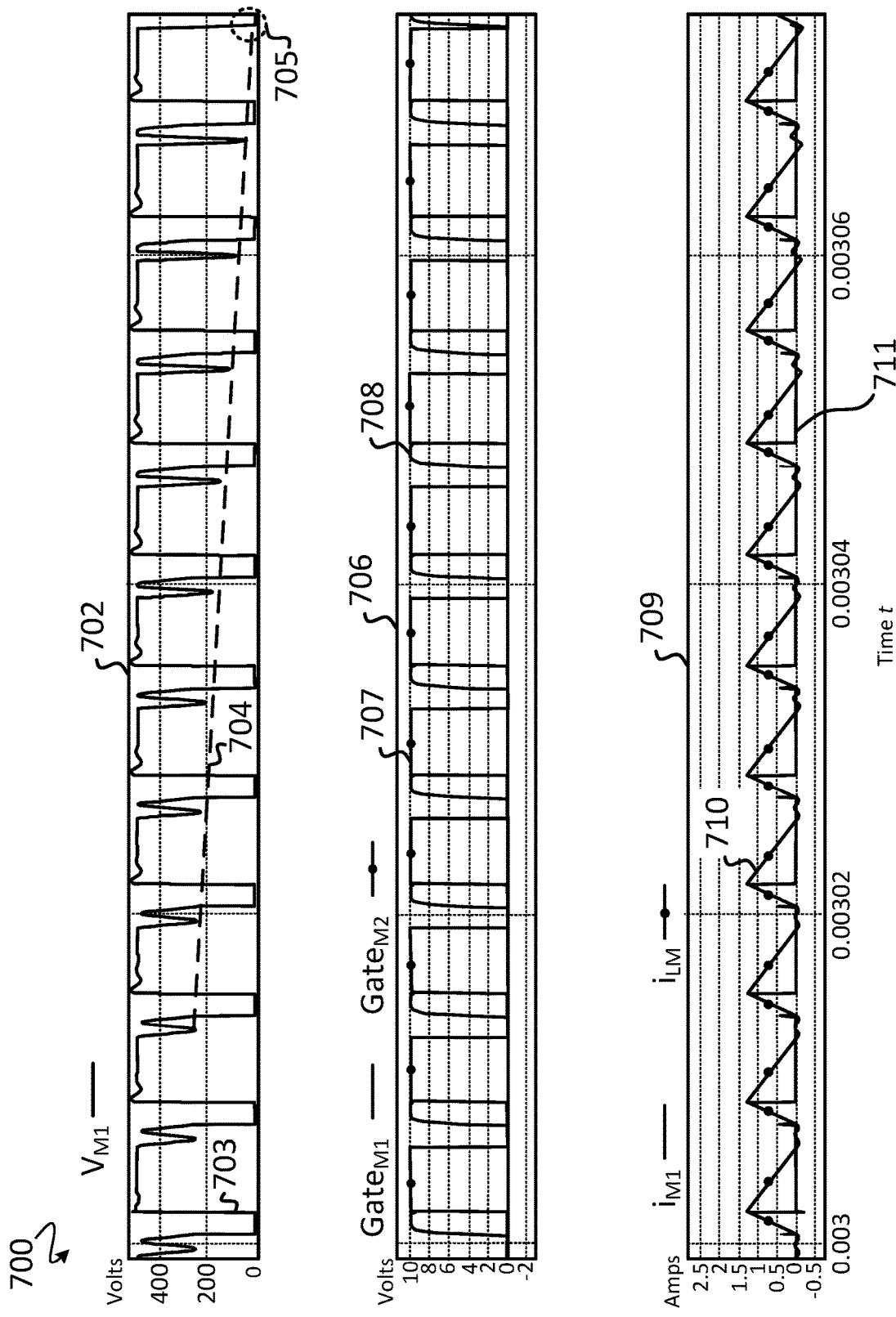
FIGS. 7A-B show simplified plots of signals related to operation of the power converter shown in FIG. 1, in accordance with some embodiments.
Figure 7B:
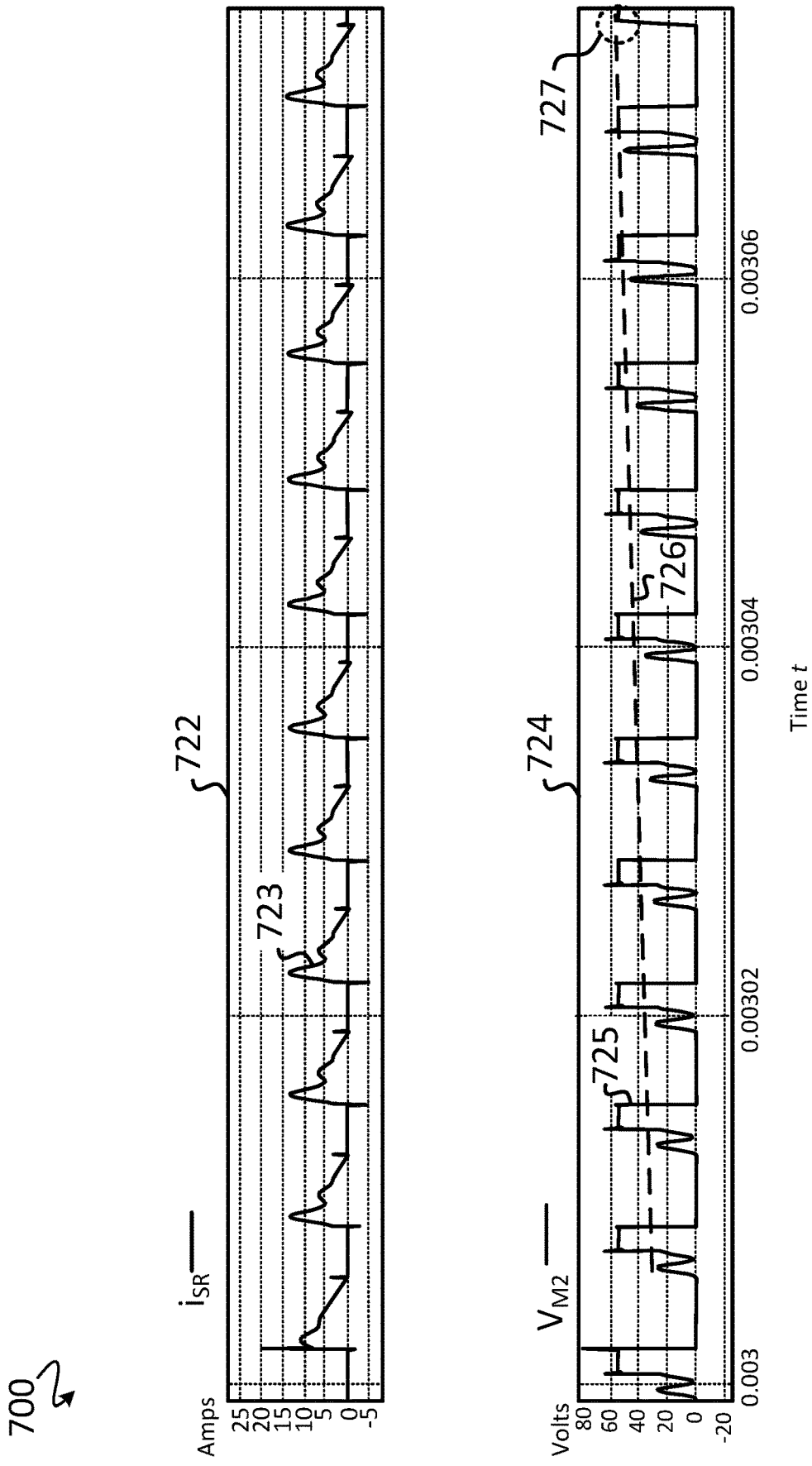

FIG. 7A shows experimental results 700 of signals related to operation of a power converter that is similar to the power converter 100 shown in FIG. 1 using an auto-tuning method similar to, or the same as, the process 400, in accordance with some embodiments. The experimental results 700 include a plot 702 of the primary-side switch drain-source voltage $V_{M1}$ 703 over time t, a dashed line 704 indicative of a minimum switching voltage of the primary-side switch M1 over time t, and a first region of interest 705. A plot 706 illustrates a plot of the synchronous rectifier switch control signal $GATE_{M2}$ 707, and a plot of the primary-side switch control signal $GATE_{M1}$ 708 over time t. A plot 709 includes a plot of the magnetizing inductance current $i_{LM}$ 710 and a plot of the primary-side switch current $i_{M1}$ 711 over time t. FIG. 7B continues the experimental results 700 of FIG. 7A, in accordance with some embodiments. A plot 722 includes a plot of the synchronous rectifier switch current $i_{SR}$ 723 over time t. A plot 724 includes a plot of the synchronous rectifier switch drain-source voltage $V_{M2}$ 725 over time t, a dashed line 726 indicative of a primary side switch valley voltage, and a second region of interest 727 corresponding to the first region of interest 705 of the plot 702. The closer the dashed line 726 is to a peak voltage of the synchronous rectifier switch drain-source voltage $V_{M2}$ 725, the closer the power converter 100 is to zero-voltage switching of the primary-side switch M1. As shown by the region of interest 705 of FIG. 7A, auto-tuning a duration of forced negative magnetizing current $i_{LM}$, by the synchronous rectifier controller 120, zero voltage switching, or near zero voltage switching of the primary-side switch M1 is achieved.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. An apparatus comprising:
   a high-pass filter circuit configured to receive a drain-source voltage from a drain node of a synchronous rectifier switch at a secondary-side of a power converter and to generate a filtered drain-source voltage using the received drain-source voltage; and
   an auto-tuning controller configured to:
   turn the synchronous rectifier switch on upon detecting a body diode conduction of the synchronous rectifier switch;
   commence an auto-tuned delay upon determining that a current through the synchronous rectifier switch has changed direction;
   turn the synchronous rectifier switch off upon expiration of the auto-tuned delay; and
   update, during a detection window of time, a duration of the auto-tuned delay based on the filtered drain-source voltage.

2. The apparatus of claim 1, wherein:
   a voltage at a drain node of a primary-side switch of the power converter is reduced, when the synchronous rectifier switch is on, by an amount corresponding to the duration of the auto-tuned delay.

3. The apparatus of claim 2, wherein:
   a maximum duration of the auto-tuned delay corresponds to a drain-source voltage at the drain node of the primary-side switch that is greater than zero volts.

4. The apparatus of claim 2, wherein:
   the auto-tuning controller is communicatively isolated from a signal representative of the voltage at the drain node of the primary-side switch.

5. The apparatus of claim 1, wherein the auto-tuning controller is further configured to:
   update the duration of the auto-tuned delay by increasing the duration of the auto-tuned delay upon determining that the filtered drain-source voltage surpassed a voltage threshold value during the detection window of time; and
   update the duration of the auto-tuned delay by decreasing the duration of the auto-tuned delay upon determining that the filtered drain-source voltage did not surpass the voltage threshold value during the detection window of time.

6. The apparatus of claim 5, further comprising:
   a voltage comparison circuit configured to generate a voltage comparison signal based on a comparison of the filtered drain-source voltage to the voltage threshold value;
   wherein the auto-tuning controller is further configured to:
   determine, upon receiving a first level of the voltage comparison signal, that the filtered drain-source voltage surpassed the voltage threshold value; and
   determine, upon receiving a second level of the voltage comparison signal, that the filtered drain-source voltage did not surpass the voltage threshold value.

7. The apparatus of claim 1, further comprising:
   a current comparison circuit configured to:
   generate a current comparison signal by comparing a current indicative of a current through the synchronous rectifier switch to a current threshold;
   wherein the auto-tuning controller is further configured to:
   determine that the body diode conduction of the synchronous rectifier switch has occurred upon receiving a first level of the current comparison signal when the synchronous rectifier switch is in an OFF-state; and
   determine that the current through the synchronous rectifier switch has changed direction upon receiving the first level of the current comparison signal when the synchronous rectifier switch is in an ON-state.

8. The apparatus of claim 7, wherein:
   the current threshold corresponds to a current of about zero amps.

9. The apparatus of claim 1, wherein:
   the power converter comprises a transformer having a primary-side winding on a primary side of the power converter and a secondary-side winding on the secondary-side of the power converter; and
   the synchronous rectifier switch is configured to be electrically coupled to the secondary-side winding.

10. The apparatus of claim 9, wherein:
    a primary-side switch is electrically coupled to the primary-side winding; and
    a duration of a forced negative magnetizing inductance current at a drain node of the primary-side switch corresponds to the duration of the auto-tuned delay.

11. The apparatus of claim 10, wherein:
    the auto-tuning controller is communicatively isolated from each of the drain node, a source node, and a gate node of the primary-side switch.

12. The apparatus of claim 10, wherein:
    an increase in the duration of the auto-tuned delay corresponds to an increased discharge amount of a parasitic capacitance of the primary-side switch; and
    a decrease in the duration of the auto-tuned delay corresponds to a decreased discharge amount of the parasitic capacitance of the primary-side switch.

13. The apparatus of claim 12, wherein:
    a maximum duration of the auto-tuned delay corresponds to maximum discharge amount of the parasitic capacitance of the primary-side switch; and the maximum discharge amount of the parasitic capacitance of the primary-side switch is less than a full discharge amount of the parasitic capacitance of the primary-side switch.

14. A method comprising:
receiving, at high-pass filter circuit, a drain-source voltage from a drain node of a synchronous rectifier switch at a secondary-side of a power converter;
generating, by the high-pass filter circuit, a filtered drain-source voltage using the received drain-source voltage;
turning the synchronous rectifier switch on upon determining by an auto-tuning controller that a body diode conduction of the synchronous rectifier switch has occurred;
commencing, by the auto-tuning controller, an auto-tuned delay upon determining that a current through the synchronous rectifier switch has changed direction;
turning the synchronous rectifier switch off upon expiration of the auto-tuned delay; and
updating, by the auto-tuning controller, during a detection window of time, a duration of the auto-tuned delay based on the filtered drain-source voltage.

15. The method of claim 14, wherein:
a voltage at a drain node of a primary-side switch of the power converter is reduced, when the synchronous rectifier switch is on, by an amount corresponding to the duration of the auto-tuned delay.

16. The method of claim 15, wherein:
a maximum duration of the auto-tuned delay corresponds to a drain-source voltage at the drain node of the primary-side switch that is greater than zero volts.

17. The method of claim 15, wherein:
the auto-tuning controller is communicatively isolated from a signal representative of the voltage at the drain node of the primary-side switch.

18. The method of claim 14, further comprising:
updating the duration of the auto-tuned delay by increasing the duration of the auto-tuned delay upon determining that the filtered drain-source voltage surpassed a voltage threshold value during the detection window of time; and
updating the duration of the auto-tuned delay by decreasing the duration of the auto-tuned delay upon determining that the filtered drain-source voltage did not surpass the voltage threshold value during the detection window of time.

19. The method of claim 14, wherein:
the duration of the auto-tuned delay corresponds to a duration of a forced negative magnetizing inductance current at a drain node of a primary-side switch of the power converter.

20. The method of claim 19, wherein:
the auto-tuning controller is communicatively isolated from each of the drain node, a source node, and a gate node of the primary-side switch.

* * * * *